US008217456B1

(12) United States Patent
Anderson et al.

(10) Patent No.: US 8,217,456 B1
(45) Date of Patent: Jul. 10, 2012

(54) LOW CAPACITANCE HI-K DUAL WORK FUNCTION METAL GATE BODY-CONTACTED FIELD EFFECT TRANSISTOR

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/046,084

(22) Filed: Mar. 11, 2011

(51) Int. Cl.
*H01L 29/778* (2006.01)

(52) U.S. Cl. ........ 257/347; 257/151; 257/153; 257/249; 257/314; 257/320; 257/331; 257/366; 257/387; 257/412; 257/E29.125; 257/E29.134; 257/E29.138; 257/E29.14; 257/E29.275; 257/E29.319; 438/149; 438/151

(58) Field of Classification Search ............... 257/347, 257/151, 153, 249, 314, 320, 331, 366, 387, 257/412, E29.131, E29.134, E29.14, E29.319, 257/E29.275; 438/149
See application file for complete search history.

(56) References Cited

U.S. PATENT DOCUMENTS

| 4,416,405 | A | 11/1983 | Caillouet |
|---|---|---|---|
| 5,327,834 | A | 7/1994 | Atkeson |
| 5,536,950 | A | 7/1996 | Liu et al. |
| 5,777,362 | A | 7/1998 | Pearce |
| 6,268,630 | B1 | 7/2001 | Schwank et al. |
| 6,307,237 | B1 | 10/2001 | Erstad |
| 6,498,371 | B1 | 12/2002 | Krishnan et al. |
| 6,506,654 | B1 | 1/2003 | Wei et al. |
| 6,624,475 | B2 | 9/2003 | Bryant et al. |
| 6,627,511 | B1 | 9/2003 | Racanelli et al. |
| 6,630,376 | B1 | 10/2003 | Krishnan et al. |
| 6,724,048 | B2 | 4/2004 | Min et al. |
| 6,740,551 | B2 | 5/2004 | Yoshida et al. |
| 6,782,499 | B2 | 8/2004 | Osada et al. |
| 6,953,738 | B2 | 10/2005 | Veeraraghavan et al. |
| 6,960,810 | B2 | 11/2005 | Fechner |
| 7,005,705 | B2 | 2/2006 | Maeda et al. |
| 7,078,773 | B2 | 7/2006 | Chan et al. |

(Continued)

OTHER PUBLICATIONS

Gupta, U.S. Appl. No. 12/051,049, Office Action Communication, Oct. 20, 2011, 10 pages.

(Continued)

*Primary Examiner* — Marc Armand
(74) *Attorney, Agent, or Firm* — Hoffman Warnick LLC; Richard M. Kotulak

(57) ABSTRACT

Disclosed herein is a field effect transistor (FET), device including a FET, and a method of making the same. In embodiments of the disclosure, a semiconductor-on-insulator (SOI) substrate is provided. The SOI substrate includes a body having a first conductivity type formed in the semiconductor layer of the SOI substrate, the body including a first body region connecting a second body region to a third body region; and a source and a drain, each having a second conductivity type, disposed on opposite sides of the first body region. A first gate electrode having a second work function is disposed above the first body region; and a second gate electrode having a first work function disposed above the second and third body regions. A first gate dielectric layer may be disposed vertically between the first body region and the first gate electrode, and a second gate dielectric layer may be disposed vertically between the second and third body regions and the second gate electrode. The first and second gate electrodes have different work functions.

20 Claims, 4 Drawing Sheets

U.S. PATENT DOCUMENTS

| | | | |
|---|---|---|---|
| 7,093,143 | B2 | 8/2006 | Ito et al. |
| 7,141,883 | B2 | 11/2006 | Wei et al. |
| 7,181,828 | B2 | 2/2007 | Yazawa et al. |
| 7,192,816 | B2 | 3/2007 | Fechner |
| 7,253,049 | B2 | 8/2007 | Lu et al. |
| 7,348,239 | B2 * | 3/2008 | Dong et al. .................. 438/257 |
| 2004/0183106 | A1 | 9/2004 | Kim et al. |
| 2006/0071691 | A1 | 4/2006 | Garlepp |
| 2006/0263972 | A1 | 11/2006 | Ahn et al. |
| 2007/0170541 | A1 | 7/2007 | Chui et al. |
| 2007/0283298 | A1 | 12/2007 | Bernstein et al. |
| 2009/0236632 | A1 | 9/2009 | Anderson et al. |
| 2009/0315138 | A1 | 12/2009 | Chang et al. |
| 2010/0081239 | A1 | 4/2010 | Min et al. |
| 2010/0159684 | A1 | 6/2010 | Chang et al. |
| 2010/0297839 | A1 * | 11/2010 | Park .............................. 438/591 |

OTHER PUBLICATIONS

Polishchuk et al., "Dual Work Function Metal Gate CMOS Transistors by Ni-Ti Interdiffusion," Apr. 2002, pp. 200-202, IEEE Electron Device Letters, vol. 23, No. 4.

Chang-Bong et al., "The Effect of Body Contact Arrangement on Thin SOI MOSFET Characteristics," 1995, pp. 467-470, Elsevier Science B.V., Microelectronic Engineering 28.

Min et al., "Partial Trench Isolated Body-Tied (PTIBT) Structure for SOI Applications," Oct. 2001, pp. 71-72, IEEE International SOI Conference.

Matloubian, "Smart Body Contact for SOI MOSFETs," downloaded Jun. 2010, pp. 128-129, IEEE Explore, KnowledgeGate from IBM Market Insights.

Hirano et al., "Impact of 0.10 um SOI CMOS with Body-Tied Hybrid Trench Isolation Structure to Break Through the Scaling Crisis of Silicon Technology," 2000, pp. 19.5.1-19.5.4, downloaded Aug. 2010 from IEEE Xplore.

Gupta, Office Action Communication for U.S. Appl. No. 12/051,049 dated Feb. 8, 2010, 12 pages.

Gupta, Office Action Communication for U.S. Appl. No. 12/051,049 dated Jul. 20, 2010, 10 pages.

Gupta, U.S. Appl. No. 12/051,049, Office Action Communication, Apr. 19, 2011, 12 pages.

* cited by examiner

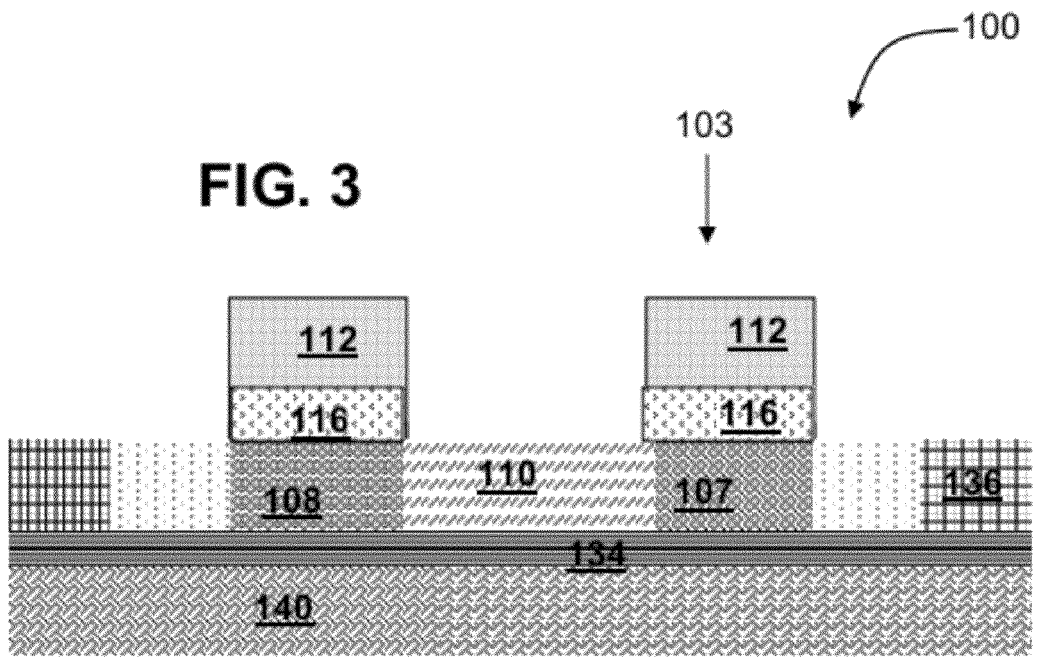
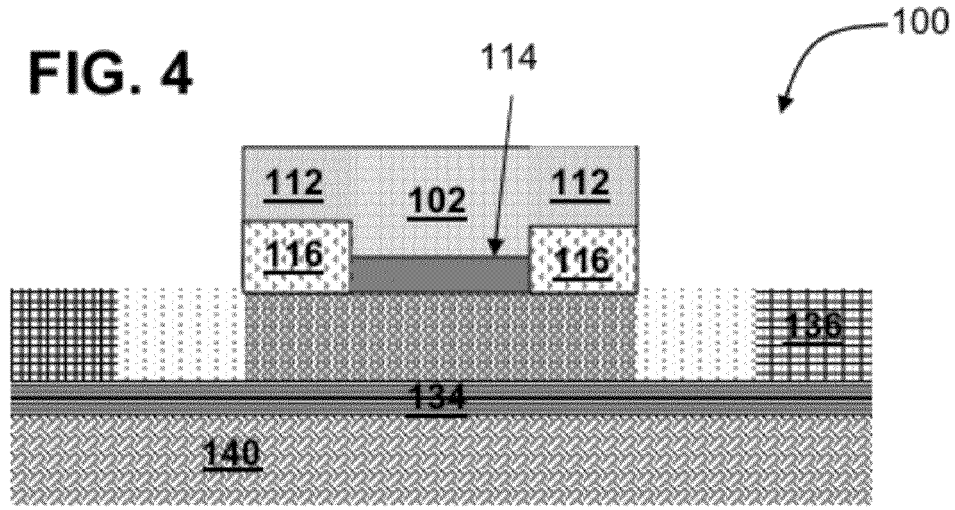

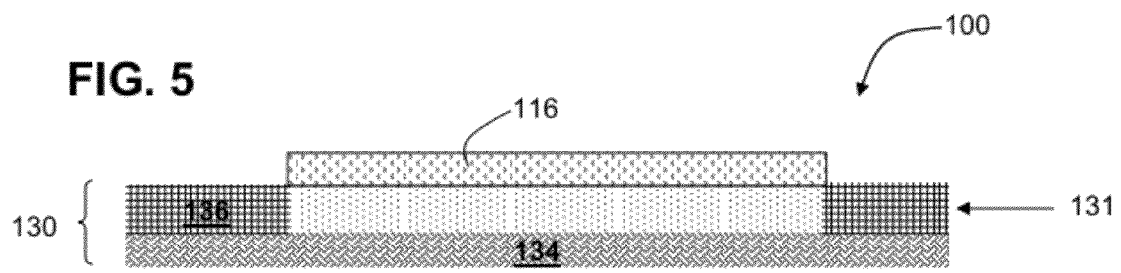
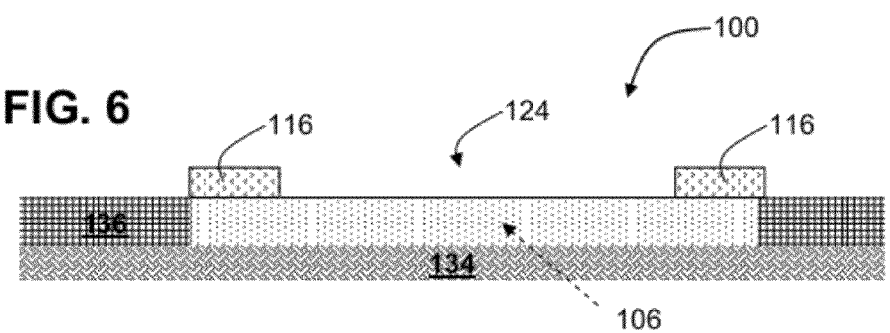
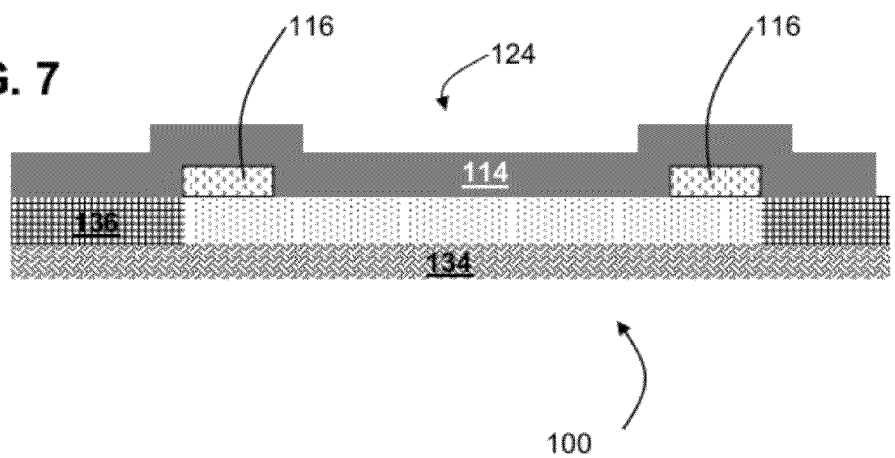

LOW CAPACITANCE HI-K DUAL WORK FUNCTION METAL GATE BODY-CONTACTED FIELD EFFECT TRANSISTOR

FIELD OF THE INVENTION

The disclosure relates generally to integrated circuit (IC) chip fabrication, and more particularly, to fabrication of a high dielectric constant (high-K) field effect transistor (FET) having low capacitance and a dual work function.

BACKGROUND

Standard complementary metal-oxide semiconductor (CMOS) technology uses a polysilicon gate with a silicon oxide gate insulator in which the polysilicon is doped to establish a p-type field effect transistor (PFET) or n-type FET (NFET). Current CMOS technology is transitioning to metal gates that use thin, high dielectric constant (high-K) gate insulators, which increases capacitance.

In partially depleted semiconductor-on-insulator (PDSOI) substrates, body contacts are made using gate extensions or extensions that do not make up part of the active gate region. The gate extension(s) add further capacitance to the FET, which slows performance. The presence of the high-K material and/or silicon germanium (SiGe) under the gate extensions magnifies the capacitance issue.

BRIEF SUMMARY

A first aspect of the disclosure provides a field effect transistor (FET) comprising a semiconductor-on-insulator (SOI) substrate including a semiconductor layer formed over a buried insulator layer. A body having a first conductivity type is formed in the semiconductor layer of the SOI substrate, the body including a first region connecting a second region to a third region, wherein the second and third regions are substantially parallel to one another. A source and a drain, each having a second conductivity type, are formed in the semiconductor layer and disposed on opposite sides of the first body region, and between the second and third body regions. A first gate electrode having a second work function is disposed above the first body region; and a second gate electrode having a first work function is disposed above the second and third body regions. A work function of the first gate electrode differs from a work function of the second electrode.

A second aspect of the disclosure provides a device comprising a field effect transistor including: a semiconductor layer; a body having a first conductivity type formed in the semiconductor layer, the body including a first region connecting a second body region to a third body region, wherein the second and third body regions are substantially parallel; and a source and a drain, each having a second conductivity type, formed in the semiconductor layer and disposed on opposite sides of the first body region, and between the second and third body regions. A first gate dielectric layer is formed over the first body region; and a second gate dielectric layer is formed over the second and third body regions. A first portion having the first conductivity type is disposed in the semiconductor layer abutting the second body region; and a second portion having the first conductivity type is disposed in the semiconductor layer abutting the third body region. A first gate electrode having a second work function is disposed above the first gate dielectric layer; and a second gate electrode having a first work function is disposed above the second gate dielectric layer.

A third aspect of the disclosure provides a method of forming a structure, the method including: providing a semiconductor-on-insulator (SOI) substrate including a semiconductor layer on a buried insulator layer; forming a trench isolation in the semiconductor layer surrounding a body region of the semiconductor layer; and forming a field effect transistor (FET) over the semiconductor layer. The FET forming further includes: forming a body having a first conductivity type formed in the semiconductor layer, the body including a first body region connecting a second body region to a third region, wherein the second and third body regions are substantially parallel; forming a source and a drain, each having a second conductivity type, in the semiconductor layer and disposed on opposite sides of the first region of the body, and between the second and third body regions; depositing a thick gate dielectric layer over the SOI substrate; using a mask, removing the thick gate dielectric layer such that an opening is created exposing the first body region; depositing a high-K gate dielectric layer over an upper surface of the thick gate dielectric and the opening; patterning the high-K gate dielectric layer, removing the high-K gate dielectric from a surface of the thick gate dielectric layer; depositing and patterning a first gate electrode having a second work function, over the high-K gate dielectric layer; and depositing and patterning a second electrode gate having a first work function, over the thick gate dielectric layer.

These and other aspects, advantages and salient features of the disclosure will become apparent from the following detailed description, which, when taken in conjunction with the annexed drawings, where like parts are designated by like reference characters throughout the drawings, disclose embodiments of the disclosure.

BRIEF DESCRIPTION OF THE DRAWINGS

The above and other aspects, features and advantages of the disclosure will be better understood by reading the following more particular description of the disclosure in conjunction with the accompanying drawings.

FIG. 3 shows a cross section of the FET of FIG. 1 along view line B-B.

FIG. 4 shows a cross section of the FET of FIG. 1 along view line C-C.

FIGS. 5-10 show a method of forming the FET of FIG. 1 in accordance with embodiments of the disclosure.

Figure 1:
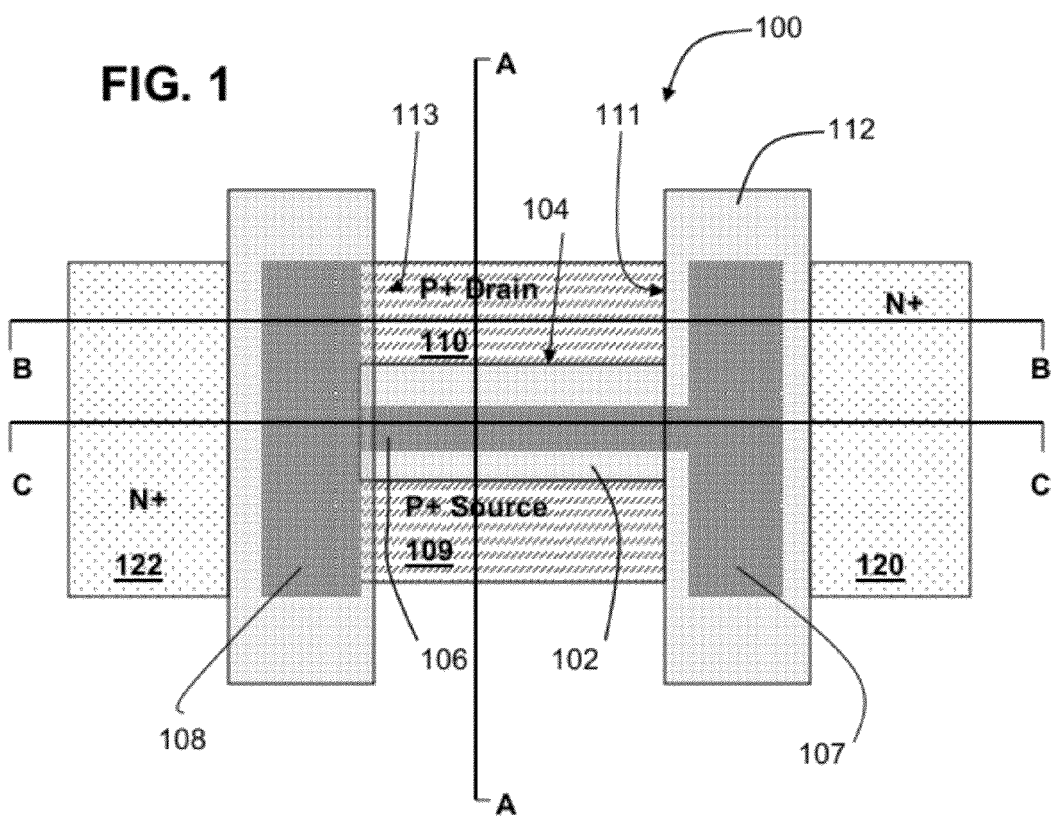
FIG. 1 shows a top view of a partially depleted semiconductor-on-insulator (PDSOI) body-contacted (BC) FET in accordance with embodiments of the disclosure.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

Figure 2:
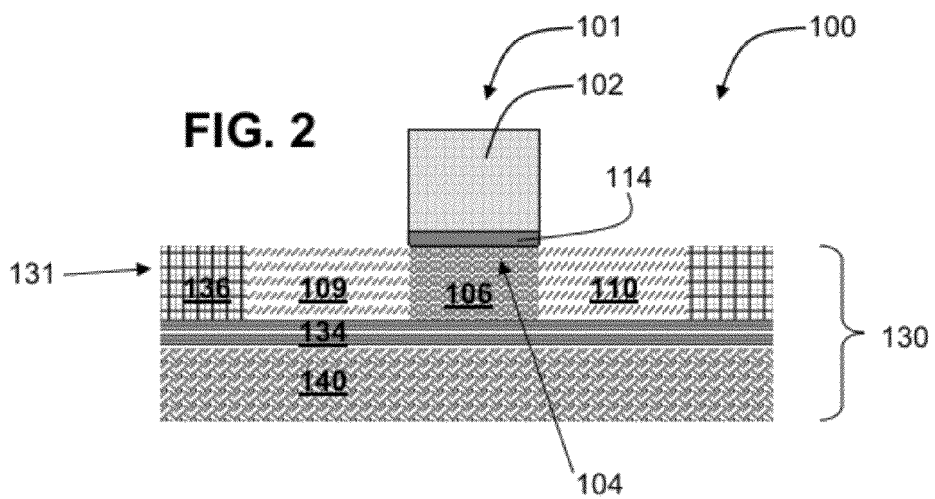
FIG. 2 shows a cross section of the FET of FIG. 1 along view line A-A.

Turning to the drawings, FIGS. 1-4 show embodiments of a body-contacted field effect transistor (FET) 100 in accordance with embodiments of the disclosure. FIG. 1 shows a top view of FET 100. FIG. 2 shows a cross-sectional view of FET 100 along line A-A in FIG. 1. FIG. 3 shows a cross-sectional view of FET 100 along line B-B in FIG. 1, and FIG. 4 shows a cross-sectional view of FET 100 along line C-C in FIG. 1.

As shown in FIG. 2, FET 100 may be formed over a partially depleted semiconductor-on-insulator (PDSOI) substrate 130, and may be separated from other devices by shallow trench isolations 136 which may be made of, e.g., silicon oxide ($SiO_2$). Substrate 130 may include a semiconductor layer 131 formed, in some embodiments, over a buried insulator layer 134. In various embodiments, semiconductor layer 131 with or without buried insulator layer 134 may be formed over a wafer 140. Semiconductor layer 131 may include, e.g., silicon; and buried insulator layer 134 may include, e.g., an oxide.

Returning to FIG. 1, a body having a first conductivity type (N− in FIGS. 2-4) and having three regions 106-108 is formed by depositing the appropriate dopants in semiconductor layer 131. A first body region 106 (N− in FIGS. 2-4), is formed such that it is laterally disposed between source 109 and drain 110 regions in semiconductor layer 131. Source 109 and drain 110 regions are formed in semiconductor layer 131 by doping to achieve a second conductivity type (P+ in FIGS. 1-3). A second body region 107 is formed in semiconductor layer 131 such that it is disposed abutting a first end 111 of first body region 106, source 109, and drain 110. A third body region 108 is formed such that it is disposed abutting a second end 113 of first body region 106, source 109, and drain 110. Thus, first, second, and third body regions 106, 107, 108 may collectively form an H-shaped body in cross-section in some embodiments (FIG. 1), in which second and third body regions 107, 108 are substantially parallel to one another. Although FIG. 1. depicts the first, second, and third body regions 106, 107, 108 in a substantially H-shaped arrangement, it is noted that such an arrangement is not necessary. Second and third body regions 107, 108 need not be the same size or shape, and need not be exactly parallel to one another. Further, first body region 106 need not be centered along second and third body regions 107, 108 with source 109 and drain 110 of equal size as depicted. In any event, the entirety of the body has the first conductivity type.

As further shown in FIG. 1, a first portion 120 in semiconductor layer 131 abuts the second body region 107. A second portion 122 in semiconductor layer 131 abuts the third body region 108. First and second portions 120, 122 have the first conductivity type (N+ in FIG. 1).

As shown in FIG. 2, a first gate stack 101 may be formed over first body region 106. First gate stack 101 may include a first gate electrode 102 having the second conductivity type (P+ in FIGS. 1-2 and 4), such that first gate electrode 102 has a corresponding second work function type near the silicon (Si) valence band edge. First gate electrode 102 may be made of metal, and may have channel 104 thereunder. A first gate dielectric layer 114 may further be provided, vertically disposed between the first body region 106 and first gate electrode 102.

As shown in FIG. 3, a second gate stack 103 may be formed over second and third body regions 107, 108. Second gate stack 103 may include a second gate electrode 112 having the first conductivity type (N+ in FIGS. 1 and 3-4) such that second gate electrode 104 has a corresponding first work function type near the Si conduction band edge. Second gate electrode 112 may be made of metal, and may be formed over a second gate dielectric layer 116. Further, second gate electrode 112 may be a body-contacted gate electrode, and may form an "H" shape with the first gate electrode 102 in some embodiments. As discussed relative to first, second, and third body regions 106, 107, 108, however, the substantially "H" shaped arrangement is not necessary; other arrangements are also considered part of the disclosure. Second gate electrode may be disposed such that it abuts both of a first end 111 of the first metal gate electrode 102 and a second and opposite end 113 of the first metal gate electrode 102 as shown in FIG. 1. Gate electrodes 102, 112 may have work functions which differ from one another, resulting in a FET 100 having a dual work function.

In some embodiments, first gate dielectric layer 114 may comprise a material having a high dielectric constant (high-K), and second gate dielectric layer 116 may be a thick oxide layer. Thus, relative to second gate dielectric layer 116, first gate dielectric layer 114 may have a different, greater dielectric constant (k). Examples of high-K materials include but are not limited to metal oxides tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity).

In another embodiment, first gate dielectric layer 114 has a first thickness, which may differ from a second thickness of the second gate dielectric layer 116. In a further embodiment, second gate dielectric layer 116 may be thicker than first gate dielectric layer 114, contributing to a reduction in parasitic capacitance associated with body-contacted second gate electrode 112.

As illustrated and as discussed above, portions of FET 100 are shown with particular dopants (e.g., N, N+, P, P−, etc.) that result in a p-type FET (PFET). It is understood, however, that the teachings of the disclosure are equally applicable to an n-type FET (NFET). In some embodiments, the body region may doped N-type, and the source and the drain may be doped P-type (as shown in FIGS. 1-4). In other embodiments not pictured but considered part of the disclosure, the body region may be doped P-type, and the source and the drain may be doped N-type. P conductivity type may be achieved by, doping with p-type dopants in which an element is introduced to semiconductor to generate a free hole (by "accepting" an electron from a semiconductor atom and "releasing" hole at the same time). The acceptor atom must have one valence electron less than the host semiconductor; boron (B) is the most common acceptor in silicon technology. Alternatives include indium and gallium (gallium features high diffusivity in $SiO_2$, and hence, oxide cannot be used as mask during Ga diffusion). N conductivity type may be achieved by doping with N-type dopants which may include but are not limited to: phosphorous (P), arsenic (As), and antimony (Sb). In N-type doping, the element introduced to the semiconductor to generate free electron (by "donating" electron to semiconductor); therefore, the element must have one more valance electron than the semiconductor. Common donors in silicon (Si) include: phosphorous (P), arsenic (As), and antimony (Sb); and in gallium arsenic (GaAs): sulphur (S), selenium (Se), tin (Sn), silicon (Si), and carbon (C).

The FET 100 depicted in FIGS. 1-4 may be formed in a number of ways. FIGS. 5-10 show embodiments of a method of forming FET 100. It is noted that in FIGS. 5-10, the different shadings used in FIGS. 1-4 to denote different dopants have been omitted for clarity.

Embodiments of this disclosure may be manufactured according to conventional lithographic processing techniques which are known in the art. In a first stage, a semiconductor-on-insulator (SOI) structure is provided. SOI substrate 130 includes a semiconductor layer 131, which may be disposed above buried insulator layer 134. In one embodiment, semiconductor layer 131 may be silicon; in other embodiments, however, semiconductor layer 131 may be made of germanium, silicon germanium, silicon carbide, among other materials. Furthermore, a portion of or an entirety of the semiconductor substrate 130 may be strained. For example, semiconductor layer 131 may be strained. Buried insulator layer 134 may include any now known or later developed insulator material such as silicon oxide ($SiO_2$). A wafer 140 under buried insulator layer 134 may be provided in some embodiments, and may include any semiconductor material listed above. These features are not intended to be limiting, however; SOI structure 130 may be obtained in any of a variety of ways known in the art.

FIG. 5 shows providing a semiconductor-on-insulator (SOI) substrate 130 including a semiconductor layer 131 over buried insulator layer 134, including shallow trench isolation regions 136 surrounding a body region of the semiconductor layer 131. A body (not labeled in FIGS. 5-10) having a first conductivity type is formed in semiconductor layer 131, including a first, second, and third region 106, 107, 108 as described above and illustrated in FIGS. 1-4. A source 109 and drain 110 having a second conductivity type are further formed in semiconductor layer 131 as described above and illustrated in FIGS. 1-3. A thick gate dielectric layer 116, which may be an oxide in some embodiments, is deposited over the SOI substrate 130, as shown in FIG. 5.

As shown in FIG. 6, using a mask, thick gate dielectric layer 116 is etched away, removing thick gate dielectric layer 116 such that an opening 124 is created exposing the first body region 106. Thick gate dielectric layer 116 remains above body regions 107, 108 (as shown in FIG. 3).

As shown in FIG. 7, a high-K gate dielectric layer 114 may then be deposited over an upper surface of the thick gate dielectric layer 116 and opening 124.

Figure 8:
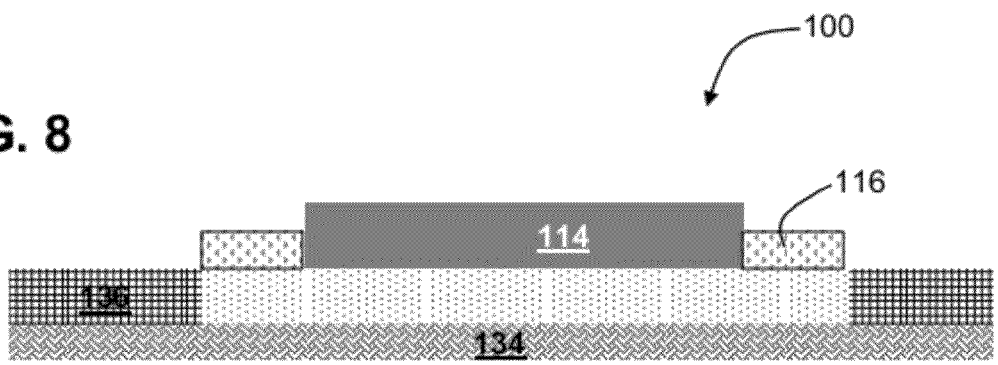

As shown in FIG. 8, the high-K gate dielectric layer 114 may then be patterned, removing high-K gate dielectric layer 114 from an upper surface of the thick gate dielectric layer 116 and shallow trench isolations 136. High-K gate dielectric layer 114 remains in opening 124 as shown in FIG. 8, and above first body region 106 as shown in FIG. 2. Gate dielectric layers 114, 116 may have different thicknesses, and in some embodiments, layer 116 may be thicker than layer 114.

Figure 9:
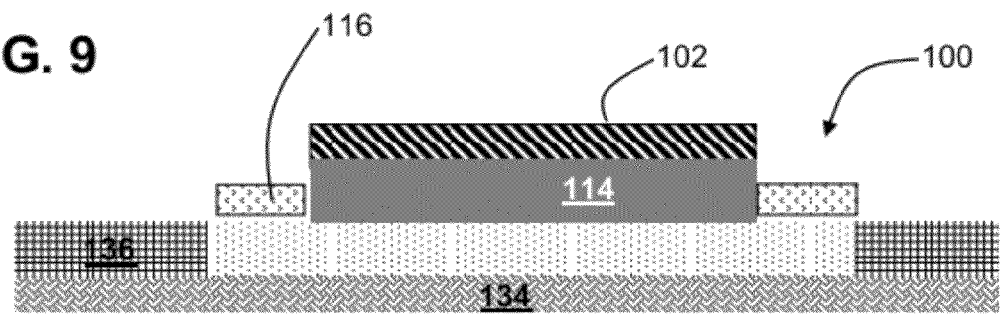
Figure 10:
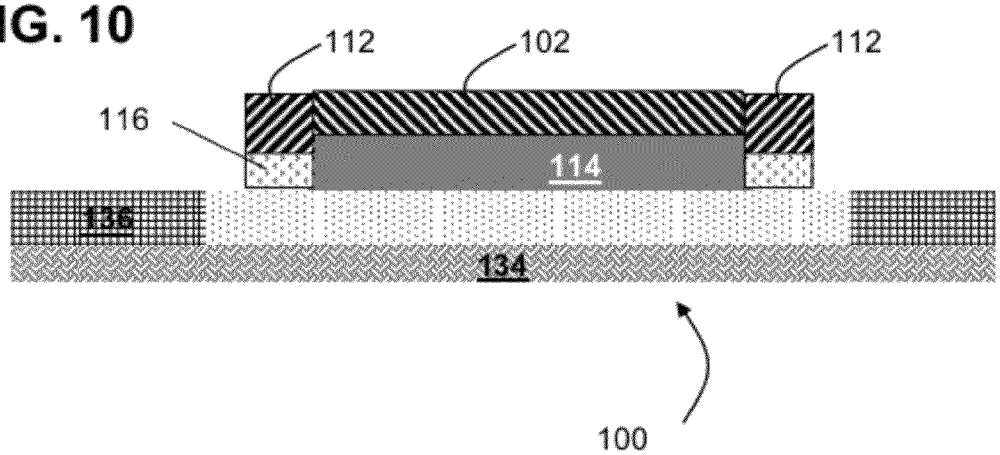

As shown in FIG. 9, a first gate electrode 102 having the second work function type may be deposited and patterned over high-K gate dielectric layer 114. The second work function type is chosen to set the threshold voltage of the underlying silicon body region to the desired value for optimum PFET operation. As in the embodiments shown in FIGS. 4 and 9, gate 102 may be a P+ work function gate that will have a work function near the Si valence band. As shown in FIG. 10, a second gate electrode 112 having the first work function type may be deposited and patterned over the thick gate dielectric layer 116. The first work function type is chosen to set the threshold voltage of the underlying silicon body region above the threshold voltage of the body region underlying the first gate electrode. The higher threshold will reduce the capacitance of the second gate electrode. As in the embodiments shown in FIGS. 4 and 10, gate 112 may be a N+ work function gate that will be near the Si conduction band. Thus, the foregoing method provides for a dual work function FET 100.

While various embodiments are described herein, it will be appreciated from the specification that various combinations of elements, variations or improvements therein may be made by those skilled in the art, and are within the scope of the disclosure. In addition, many modifications may be made to adapt a particular situation or material to the teachings of the disclosure without departing from essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A field effect transistor (FET) comprising:
   a semiconductor-on-insulator (SOI) substrate including a semiconductor layer formed over a buried insulator layer;
   a body having a first conductivity type formed in the semiconductor layer of the SOI substrate, the body including a first body region connecting a second region to a third region, wherein the second and third regions are substantially parallel;
   a source and a drain, each having a second conductivity type, formed in the semiconductor layer and disposed on opposite sides of the first body region, and between the second and third body regions;
   a first gate electrode having a second work function disposed above the first body region; and
   a second gate electrode having a first work function disposed above the second and third body regions,
   wherein the second work function of the first gate electrode differs from the first work function of the second gate electrode.

2. The FET of claim 1, further comprising a first gate dielectric layer disposed between the first body region and the first gate electrode, and a second gate dielectric layer disposed between the second and third body regions and the second gate electrode, wherein the second gate dielectric layer differs in thickness from the first gate dielectric layer.

3. The FET of claim 1, wherein the first conductivity type is N-type and the second conductivity type is P type.

4. The FET of claim 1, wherein the first conductivity type is P-type and the second conductivity type is N type.

5. The FET of claim 2, wherein the second gate dielectric layer is thicker than the first gate dielectric layer.

6. The FET of claim 2, wherein the first and second gate dielectric layers have different dielectric constants.

7. The FET of claim 2, wherein the first gate dielectric layer further comprises a high dielectric constant (high-K) dielectric material.

8. A device comprising:
   a field effect transistor including:
     a semiconductor layer;
     a body having a first conductivity type formed in the semiconductor layer, the body including a first body region connecting a second body region to a third body region, wherein the second and third regions are substantially parallel;
     a source and a drain, each having a second conductivity type, formed in the semiconductor layer and disposed on opposite sides of the first body region, and between the second and third body regions;
     a first gate dielectric layer over the first body region;
     a second gate dielectric layer over the second and third body regions;
     a first portion having the first conductivity type in the semiconductor layer abutting the second body region;
     a second region having the first conductivity type in the semiconductor layer abutting the third body region;
     a first gate electrode having a second work function disposed above the first gate dielectric layer; and
     a second gate electrode having a first work function disposed above the second gate dielectric layer.

9. The device of claim 8, wherein the first and second gate electrodes comprise metal.

10. The device of claim 8, wherein a work function of the first gate electrode differs from a work function of the second gate electrode.

11. The device of claim 8, wherein a dielectric constant of the first gate dielectric layer differs from a dielectric constant of the second gate dielectric layer.

12. The device of claim 8, wherein the first gate dielectric layer further comprises a high dielectric constant (high-K) dielectric material.

13. The device of claim 8, wherein a thickness of the first gate dielectric layer differs from a thickness of the second gate dielectric layer.

14. The device of claim 13, wherein the thickness of the second gate dielectric layer is greater than the thickness of the first gate dielectric layer.

15. A method of forming a structure comprising:
provichng a semiconductor-on-insulator (SOI) substrate including a semiconductor layer on a buried insulator layer:
forming a trench isolation in the semiconductor layer surrounding a body region of the semiconductor layer;
forming a field effect transistor (FET) over the semiconductor layer, the FET forming including:
forming a body having a first conductivity type in the semiconductor layer, the body including a first body region connecting a second body region to a third body region, wherein the second and third body regions are substantially parallel;
forming a source and a drain, each having a second conductivity type, in the semiconductor layer and disposed on opposite sides of the first body region, and between the second and third body regions;
depositing a thick gate dielectric layer over the SOI substrate;
removing the thick gate dielectric layer such that an opening is created exposing the first body region;
depositing a high-K gate dielectric layer over an upper surface of the thick gate dielectric layer and the opening;
removing the high-K gate dielectric layer from a surface of the thick gate dielectric layer;
depositing and patterning a first gate electrode having a second work function, over the high-K gate dielectric layer; and
depositing and patterning a second gate electrode having a first work function, over the thick gate dielectric layer.

16. The method of claim 15, wherein the first and the second gate electrodes have different work functions.

17. The method of claim 15, wherein the thick gate dielectric layer further comprises an oxide.

18. The method of claim 15, wherein a thickness of the thick gate dielectric layer is different from a thickness of the high-K gate dielectric layer.

19. The method of claim 15, wherein the first conductivity type is N-type and the second conductivity type is P type.

20. The method of claim 18, wherein a thickness of the thick gate dielectric layer is greater than a thickness of the high-K gate dielectric layer.

* * * * *